(12) United States Patent
Dick

(10) Patent No.: US 6,300,811 B1
(45) Date of Patent: Oct. 9, 2001

(54) DIFFERENTIAL AMPLIFIER

(75) Inventor: Burkhard Dick, Hamburg (DE)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/517,724

(22) Filed: Mar. 2, 2000

(30) Foreign Application Priority Data

Mar. 4, 1999 (DE) .............................................. 199 09 492

(51) Int. Cl.$^7$ ....................................................... H03F 3/45
(52) U.S. Cl. .......................................... 327/252; 327/257
(58) Field of Search .................................. 330/252, 257, 330/260, 261; 327/561, 562, 563

(56) References Cited

U.S. PATENT DOCUMENTS

| | | | |
|---|---|---|---|
| 4,456,887 | 6/1984 | Tokumo | 330/261 |
| 5,014,019 | * 5/1991 | Tanaka | 330/257 |
| 5,142,242 | * 8/1992 | Schaffer | 330/252 |
| 5,699,010 | 12/1997 | Hatanaka | 327/563 |
| 5,821,812 | * 10/1998 | Park et al. | 330/260 |
| 5,838,149 | * 11/1998 | Perrand | 323/315 |

OTHER PUBLICATIONS

"Bipolar Linear Transconductor", by W. Chung et al, Electronics Letters, vol. 26, No. 10, May 1990.

* cited by examiner

*Primary Examiner*—Tuan T. Lam
(74) *Attorney, Agent, or Firm*—Steven R. Biren

(57) ABSTRACT

A differential amplifier includes a first amplifier transistor whose base terminal is coupled to an emitter terminal of a first emitter-follower transistor, a second amplifier transistor whose base terminal is coupled to an emitter terminal of a second emitter-follower transistor, a first emitter impedance across which the emitter terminals of the first and second amplifier transistors are coupled to each other, while base terminals of the emitter-follower transistors can be supplied with a differential voltage for controlling the differential amplifier. In order to enable stable operation and also a characteristic curve that is linear over rather large dynamic ranges, such a differential amplifier according to the invention includes a power transfer circuit by which a first current is supplied to the emitter terminal of the first emitter-follower transistor in a voltage-decoupled manner, which first current has such a predefined proportion to a collector current in a collector terminal of the second amplifier transistor due to the configuration of the first emitter-follower transistor and of the second amplifier transistor that a base-emitter voltage occurring on the first emitter-follower transistor substantially corresponds to a base-emitter voltage occurring on the second amplifier transistor. The power transfer circuit similarly applies a second current to the emitter terminal of the second emitter-follower transistor in a voltage-decoupled manner.

9 Claims, 3 Drawing Sheets

DIFFERENTIAL AMPLIFIER

BACKGROUND OF THE INVENTION

The invention relates to a differential amplifier comprising at least:
- a first amplifier transistor whose base terminal is coupled to an emitter terminal of a first embitter-follower transistor,
- a second amplifier transistor whose base terminal is coupled to an emitter terminal of a second emitter-follower transistor,
- a first emitter impedance across which the emitter terminals of the first and second amplifier transistors are coupled to each other,
- while base terminals of the emitter-follower transistors can be supplied with a differential voltage for controlling the differential amplifier.

In bipolar circuit technology it is known that an emitter negative feedback is used for linearizing differential amplifiers. Emitter terminals of bipolar transistors which form a differential amplifier are not coupled to each other direct but via at least one emitter impedance, which is preferably formed by an ohmic resistance. The larger the resistance value of this emitter impedance is, compared with the internal resistance of the transistors at their emitter terminals, the more linear the transfer characteristic becomes of a thus arranged differential amplifier. Since, however, with an increasing voltage swing of the transistors of the differential amplifier via their base terminals via a difference signal, the current in a respective one of the transistors of the differential amplifier decreases more and more and, consequently, its internal resistance at the emitter terminal increases, for these large voltage swings the linearization effect of the emitter impedance is curtailed accordingly.

FIG. 1 shows such an arrangement for an emitter-coupled differential amplifier which comprises a first amplifier transistor 1, a second amplifier transistor 2 and two emitter resistors 3, 4 which, connected in series, connect emitter terminals of the amplifier transistors 1, 2 to each other. A constant-current source 5, which is connected to ground 6 in the circuit diagram shown, is connected to the interconnected terminals of the emitter resistors 3 and 4 remote from the emitter terminals. Each of the emitter resistors 3 or 4 then forms an emitter impedance.

When the circuit arrangement shown in FIG. 1 is in operation, the constant-current source 5 produces a constant current I01. This constant current I02 is distributed over the collector emitter paths of the two amplifier transistors 1, 2 in accordance with the differential voltage DU applied between the base terminals of the amplifier transistors 1, 2, which differential voltage DU is used as an input voltage of the differential amplifier shown in FIG. 1. An increase of the current in the collector emitter path of one of the amplifier transistors, 1, 2 then directly leads to a reduction of the current in the collector emitter path of the other one of the amplifier transistors 1, 2. For the following exposition only the current deviations from their operating point which are caused by voltage swings are considered, i.e. deviations from half the value of the constant current I01. These deviations form an alternating current which is shown in FIG. 1 as a collector current IC or emitter current IE on the first amplifier transistor 1, while for simplicity of the exposition there may also be assumed that with sufficiently large current gain of the amplifier transistors 1, 2, these currents match in essence. The alternating current described, referenced IC or IE, thus flows from the collector terminal of the first amplifier transistor, via its collector emitter path, the two emitter resistors 3, 4 and the collector emitter path of the second amplifier transistor, but through the latter, in opposite direction compared to the first amplifier transistor 1, to the collector terminal of the second amplifier transistor 2.

FIG. 2 shows a basic circuit diagram of a transfer characteristic curve between the collector current IC of the first amplifier transistor 1 and the differential voltage UD at the base terminals of the amplifier transistors 1, 2, which characteristic curve can be achieved with such an emitter negative feedback differential amplifier arrangement. The emitter negative feedback by the emitter impedances 3, 4 provides a linearization of this characteristic curve in a range around its origin (UD=0, IC=0), but for larger voltage swings, i.e. larger values of UD, roundings are shown both in positive and in negative direction, i.e. non-linear influences in this characteristic curve.

A computation of the characteristic curve of FIG. 2 shows that the difference between the two base-emitter voltages of the amplifier transistors 1, 2 is included in the transfer function of the circuit arrangement shown in FIG. 1. This difference between the base-emitter voltages is non-linearly combined with the collector current IC and, as a result, provides a non-linear contribution to the characteristic curve shown in FIG. 2.

For a further linearization of the characteristic curve of a differential amplifier, a circuit arrangement is proposed as shown in FIG. 3. Elements included therein and corresponding to those of FIG. 1 are referenced by like characters. Also the circuit arrangement shown in FIG. 3 comprises a differential amplifier which comprises two amplifier transistors 1, 2 whose emitter terminals are interconnected via emitter resistors 3, 4, while a constant-current source connected to ground 6 is connected to a node between the emitter resistors 3, 4, which constant-current source produces a constant current I02 and is referenced 15. In FIG. 3 a first and a second emitter-follower transistor 11, 12 respectively, are added to this arrangement insofar as it corresponds to FIG. 1. The base terminal of the first amplifier transistor 1 is coupled to an emitter terminal of the first emitter-follower transistor 11, and the base terminal of the second amplifier transistor 2 is coupled to the emitter terminal of the second emitter-follower transistor 12. This coupling is established in FIG. 3 by a direct DC connection. Furthermore, the emitter terminal of the emitter-follower transistor 11 is connected to the collector terminal of the second amplifier transistor 2, and the emitter terminal of the second emitter-follower transistor 12 is connected to the collector terminal of the first amplifier transistor 1. As a result, there is a cross coupling or feedback in the way of a bistable multivibrator. From the emitter-follower transistors 11, 12 are now tapped from their collector terminals the collector currents used as output currents of the differential amplifier arrangement according to FIG. 3. The emitter currents IE and collector currents IC are again understood to be AC currents just like FIG. 1.

If in the circuit arrangement shown in FIG. 3 the transfer function is computed as a relation between the collector current IC and the differential voltage UD, which is now available via the base terminals of the emitter-follower transistors 11, 12, it turns out that the non-linear influences of the base-emitter voltages of the amplifier transistors 1, 2 compensate for the accordingly oppositely directed non-linear influences of base-emitter voltages of the emitter-follower transistors 11, 12, so that a considerably improved linearization of the characteristic curve between the collector current IC and the differential voltage UD is achieved. More particularly, the non-linear influences of the base-emitter voltages of the second emitter-follower transistor 12 cancel out those of the first amplifier transistor 1 and those of the first emitter-follower transistor 11 cancel out those of the second amplifier transistor 2. The collector current IC, and thus the emitter current IE, may then be well approximated according to Ohm's law from the differential voltage UD and the sum of the resistances of the emitter resistors 3, 4. However, the phase between these input and output magnitudes of the differential amplifier arrangement shown in FIG. 3, compared to the relation for the differential amplifier arrangement shown in FIG. 1 has turned through 180°, so that the result is a characteristic curve with a negative rise, as is shown in FIG. 4. Non-linear roundings of this characteristic curve when the value of the collector current IC approaches the constant current 102 are much smaller than respective distortions of the characteristic curve shown in FIG. 2.

However, it turns out that the circuit arrangement shown in FIG. 3 has disadvantages for certain operational situations. It can be noticed, for example, that when the arrangement shows a voltage swing with a differential voltage exceeding about 500 mV (for bipolar silicon transistors), the amplifier transistors 1, 2 become saturated. With an integration of such a differential amplifier arrangement and thus of the amplifier transistors 1, 2 on a semiconductor crystal effected in a general manner, high leakage currents may then evolve in the substrate of the semiconductor crystal, which lead to unwanted effects and are thus to be avoided at all costs. For this reason the dynamic range of such a differential amplifier arrangement is very limited. Furthermore, the structure of the differential amplifier arrangement shown in FIG. 3 by way of a bistable multivibrator, i.e. with a closed negative feedback loop, there is always the danger of instability, more particularly when relatively small resistances are selected for the emitter resistors 3, 4, which may be necessary, for example, to limit the voltages occurring across the emitter resistors 3, 4 in the case of a predefined collector current. In the borderline case the circuit arrangement shown in FIG. 3 then actually shows the behavior of a bistable multivibrator.

The fact that in the circuit arrangement shown in FIG. 3 the amplifier transistors 1, 2 become saturated relatively early furthermore provides that the phase of the collector current IC turns back to the phase position in accordance with the arrangement shown in FIGS. 1 and 2 when there are rather large voltage swings. If the differential amplifier arrangement shown in FIG. 3 is included in a closed loop control system, this phase shift occurring when there is saturation may lead to instabilities of the whole control system.

SUMMARY OF THE INVENTION

It is an object of the invention to provide a differential amplifier, which has a characteristic curve that is linear also over larger dynamic ranges and enables stable operation.

According to the invention, this object is achieved with a differential amplifier of the type defined in the opening paragraph by means of a power transfer circuit by which the emitter terminal of the first emitter-follower transistor, while being voltage decoupled, is supplied with a first current which has a proportion to a collector current in a collector terminal of the second amplifier transistor that is predefined by the configuration of the first emitter-follower transistor and of the second amplifier transistor, so that a base-emitter voltage occurring on the first emitter-follower transistor at least substantially matches a base-emitter voltage occurring on the second amplifier transistor and by which a second current is applied to the emitter terminal of the second emitter-follower transistor which is voltage decoupled, which second current has a proportion to a collector current in a collector terminal of the first amplifier transistor that is predefined by the configuration of the second emitter-follower transistor and of the first amplifier transistor, so that a base-emitter voltage occurring on the second emitter-follower transistor at least substantially matches a base-emitter voltage occurring on the first amplifier transistor.

The invention is based on the recognition that the saturation of the amplifier transistors 1, 2, which saturation occurs in the differential amplifier circuit shown in FIG. 3, features a central cause both for the limited possibility of voltage swing of this differential amplifier circuit and for their tendency to feature instability. This saturation is influenced by ensuing electric potentials at the base terminals and collector terminals of the amplifier transistors 1,2 when the differential amplifier arrangement shows a larger voltage swing, i.e. when the value of the differential voltage is increased.

With the embodiment of the differential amplifier arrangement according to the invention comprising the power transfer circuit described it is possible, however, to keep the currents at least unchanged, in essence, more particularly emitter currents and collector currents ensuing from the operating differential amplifier arrangement described above, without, however, the electrical potentials at the collector, base or emitter terminals of the amplifier transistors being developed which influence the saturation. This achieves, on the one hand, a linearization as it is found in the differential amplifier arrangement shown in FIG. 3 and, on the other, however, an improved possibility of voltage swing and an improved stability. The differential amplifier according to the invention as a whole has a relatively simple structure and can particularly be integrated with a semiconductor body. It may be operated with very small supply voltages.

Advantageously, the power transfer circuit in the differential amplifier according to the invention comprises at least one current mirror arrangement for deriving the first or second current respectively from the collector currents of the amplifier transistors. Generally, a current mirror arrangement represents simple and effective equipment for transferring a current especially in an integrated semiconductor circuit from an electric potential to another electric potential decoupled therefrom.

In a further embodiment of the differential amplifier according to the invention, the power transfer circuit comprises a first branch for deriving the first current from the collector current of the second amplifier transistor and a second branch for deriving the second current from the collector current of the first amplifier transistor. In a comparable fashion to the differential amplifier arrangement shown in FIG. 3 are thus established current couplings between the collector terminals of the amplifier transistors and the emitter terminals of the emitter-follower transistors via a cross, relating to the coupling of the base terminals of the amplifier transistors and the emitter terminals of the emitter-follower transistors. The first current applied to the emitter terminal of the first emitter-follower transistor is thus in this further embodiment of the differential amplifier according to the invention derived from the collector current of the second amplifier transistor in the first branch and, accordingly, the second current, which is applied to the emitter terminal of the first emitter-follower transistor, is derived from the collector terminal of the first amplifier transistor in the second branch. Preferably, this derival is effected via current mirror arrangements while the first and second branches comprise each at least one current mirror arrangement.

More particularly in a symmetrically structured differential amplifier arrangement the alternating currents flowing in the collector emitter paths of the amplifier transistors are equal to each other. As a result thereof, the first current can also be derived from the collector current of the first amplifier transistor and, accordingly, the second current from the collector current of the second amplifier transistor. In a corresponding further embodiment of the differential amplifier according to the invention, the power transfer circuit comprises a first branch for deriving the first current from the collector current of the first amplifier transistor and a second branch for deriving the second current from the collector current of the second amplifier transistor.

However, since the collector current in the second amplifier transistor, i.e. the alternating current, flows in reverse direction to the collector current in the first amplifier transistor, a respective current reversal is to be taken into account to keep a correct phase relation of the currents. This is preferably the result of the first and second branch which comprise at least one current mirror arrangement and, in addition, at least one current reversing stage each.

In the differential amplifier according to the invention, output currents may be tapped from different points in the circuit, for example, different devices may be provided for tapping output currents. In a first embodiment, the differential amplifier according to the invention is characterized by a third amplifier transistor whose base terminal is coupled to the base terminal of a first amplifier transistor, a fourth amplifier transistor whose base terminal is coupled to the base terminal of the second amplifier transistor, at least a second emitter impedance via which the emitter terminals of the third and fourth amplifier transistors are coupled to one another, and in that output currents of the differential amplifier can be derived from collector terminals of the third and of the fourth amplifier transistor.

In this embodiment of the differential amplifier according to the invention, the arrangement comprising the first and the second amplifier transistor is used only for linearizing the transfer function of the differential amplifier. For amplifying the output current, i.e. collector current of amplifier transistors to be tapped as a useful signal from the differential amplifier in this embodiment according to the invention, an additional differential amplifier arrangement formed by the third and the fourth amplifier transistor is provided, which is driven in parallel with the first differential amplifier arrangement formed by the first and the second amplifier transistor. Preferably, these two differential amplifier arrangements are dimensioned identically.

Another embodiment of the differential amplifier according to the invention is provided in that a respective one of the current mirror arrangements of the first and second branches of the power transfer circuit is arranged for deriving a respective one of the output currents of the differential amplifier. In lieu of the additional differential amplifier arrangement described above, the said current mirror arrangements have additional current paths whose currents can be tapped as output currents.

In another embodiment of the differential amplifier according to the invention, its output currents may also be tapped from collector terminals of the emitter-follower transistors. In that case, additional arrangements for tapping the output currents may be omitted.

BRIEF DESCRIPTION OF THE DRAWING

In the drawing, in which like elements carry like references, and in which.

Figure 6:
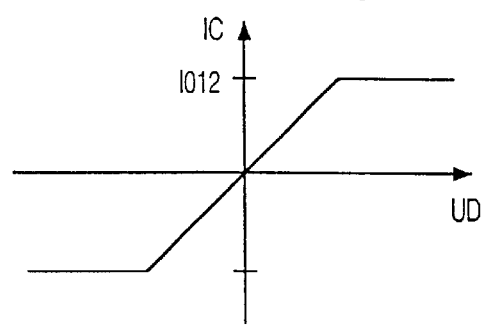
FIG. 6 shows the characteristic curve of the arrangement shown in FIG. 5.
Figure 7:
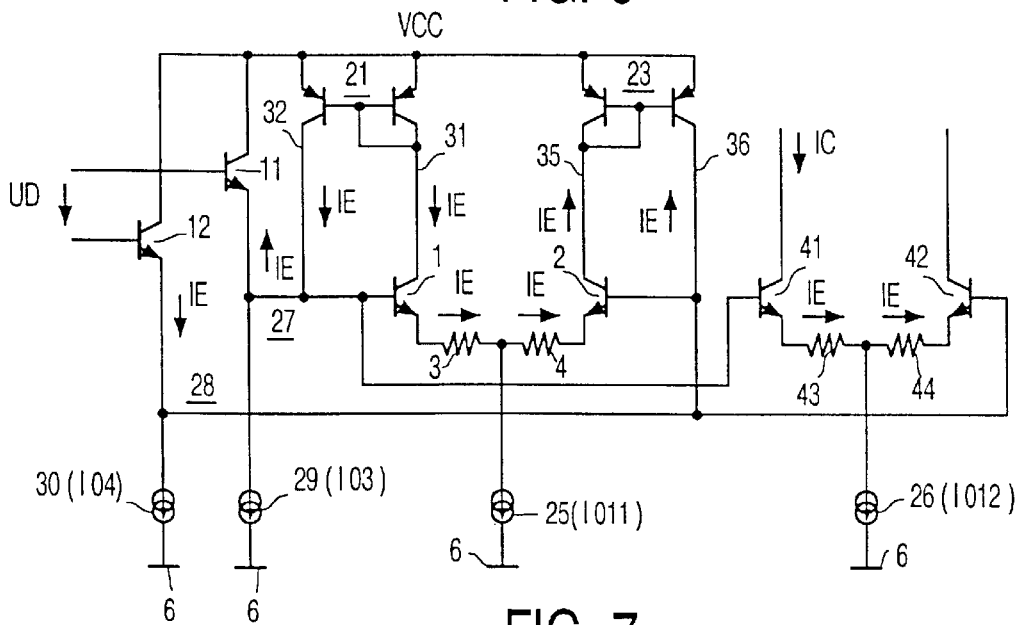
FIG. 7 shows a second example of embodiment of a differential amplifier according to the invention.

The characteristic curve shown in FIG. 6 also holds for the example of embodiment of FIG. 7.

DESCRIPTION OF THE PREFERRED EMBODIMENTS

Figure 5:
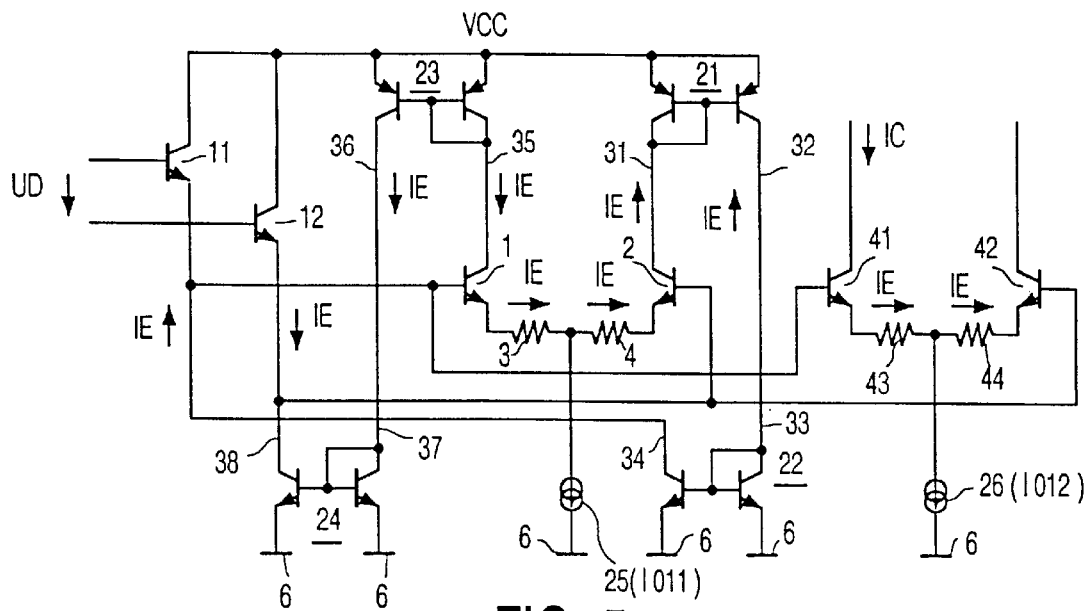
FIG. 5 shows a first example of embodiment of a differential amplifier according to the invention.

The differential amplifier shown in FIG. 5 as an example of embodiment of the invention again comprises the arrangement of two emitter-coupled amplifier transistors 1, 2 coupled via two emitter resistors 3, 4. From the node of the emitter resistors 3, 4, a constant-current source 25 is connected to ground 6. The constant-current source 25 carries a direct current having magnitude I011. The first amplifier transistor 1 is coupled with its base terminal to the emitter terminal of a first emitter-follower transistor 11, and the base terminal of the second amplifier transistor 2 is coupled to the emitter terminal of a second emitter-follower transistor 12. Between the base terminals of the emitter-follower transistors 11, 12 is again applied a differential voltage UD working as an input voltage of the differential amplifier shown in FIG. 5.

Figure 1:
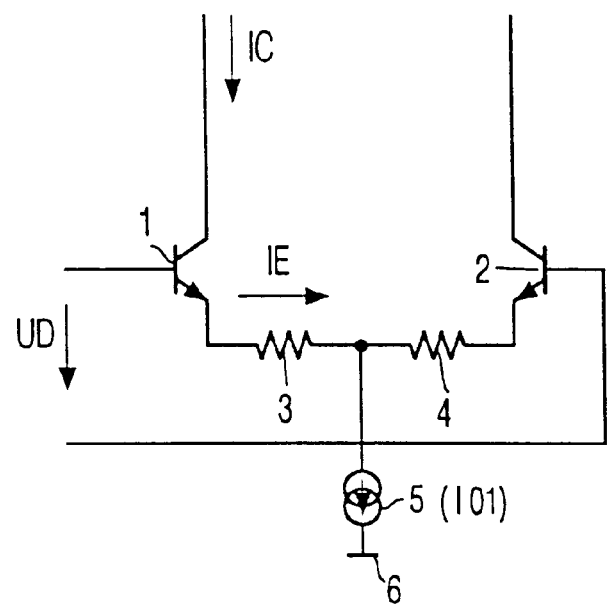
FIG. 1 shows a first described, emitter-coupled differential amplifier arrangement.
Figure 2:
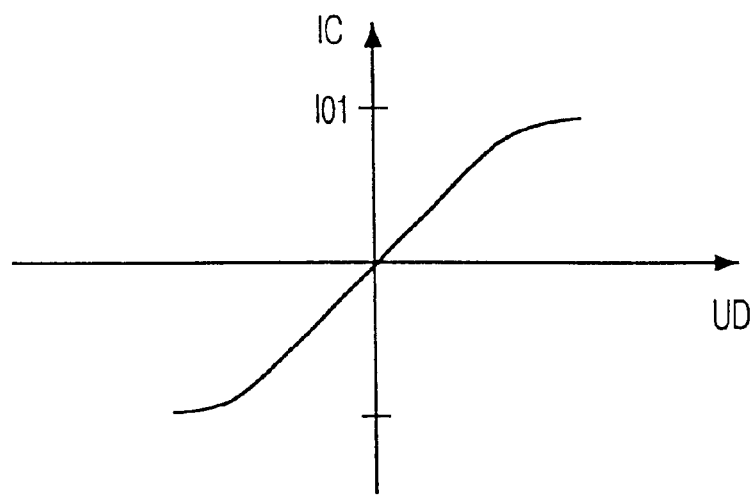
FIG. 2 shows the characteristic curve of the arrangement shown in FIG. 1.
Figure 3:
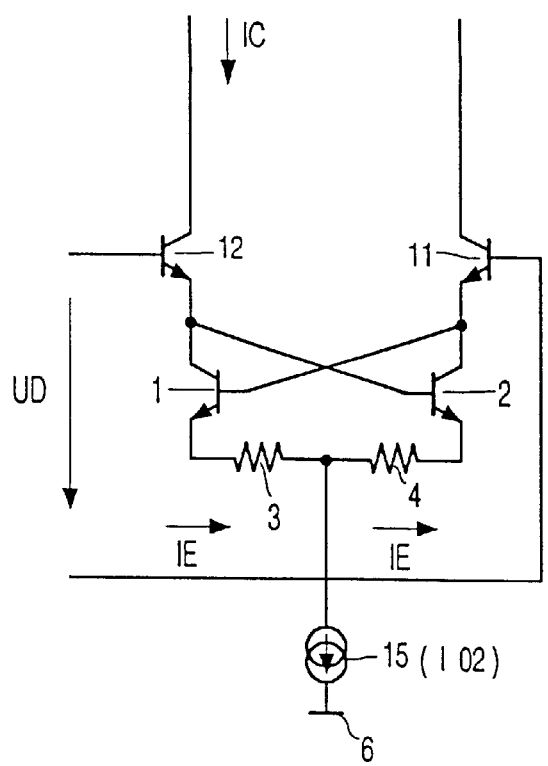
FIG. 3 shows a second described, linearized differential amplifier arrangement
Figure 4:
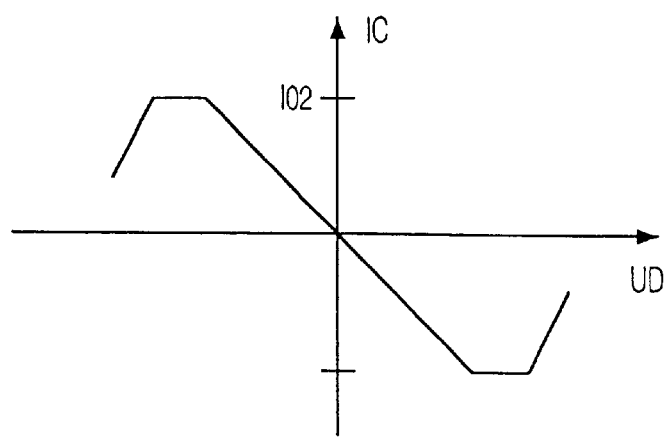
FIG. 4 shows the characteristic curve of the arrangement shown in FIG. 3, furthermore

The arrangement shown in FIG. 5 further includes a power transfer circuit, which in the present example of embodiment comprises four current mirror arrangements 21, 22, 23 and 24. In the power transfer circuit the first current mirror arrangement 21 and the second current mirror arrangement 22 form a first branch, while the third current mirror arrangement 23 and the fourth current mirror arrangement 24 form a second branch. The first branch 21, 22 of the power transfer circuit conveys a first current to the emitter terminal of the first emitter-follower transistor 11, which current is derived by the current mirror arrangements 21, 22 from the collector current of the second amplifier transistor 2 and, as a result, has a predefined proportion to this collector current. For simplicity's sake it may be assumed for the example of embodiment shown in FIG. 5 that the first emitter-follower transistor 11, the second amplifier transistor 2 and the current mirror arrangements 21, 22 are designed such that, except for base currents, the collector current of the second amplifier transistor corresponds to the first current. In each case it is achieved that with the selected dimensioning a base-emitter voltage occurring on the first emitter-follower transistor 11 at least substantially corresponds to a base-emitter voltage occurring on the second amplifier transistor 2. As a result, in a manner corresponding to FIG. 3, the influences of these base-emitter voltages accordingly stand out, so that their non-linear influences do not have any effect on the characteristic curve of the differential amplifier.

In order to achieve this, input 31 of the first current mirror arrangement 21 is connected to the collector terminal of the second amplifier transistor 2. The first current mirror arrangement 21 comprises two base-coupled pnp transistors whose emitter terminals are connected to a terminal for a supply voltage VCC. One of these transistors is short-circuited between its collector terminal forming the input 31 to the first current mirror arrangement 21 and its base terminal; the second transistor forms with its collector terminal an output 32 of the first current mirror arrangement 21. This simplest form of a current mirror arrangement is represented only by way of example; for a precise power transfer can be used so-called Wilson current mirrors instead of this arrangement.

The output 32 of the first current mirror arrangement 21 is connected to input 33 of the second current mirror arrangement 22. For the second current mirror arrangement 22 is shown a circuit that is comparable to the first current mirror arrangement 21, but has npn transistors whose emitter terminals are connected to ground 6. For the second current mirror arrangement 22 the observation made with respect to the first current mirror arrangement 21 also holds. The first current is then tapped from the output 34 of the second current mirror arrangement 22 and this is applied to the emitter terminal of the first emitter-follower transistor 11. This first current is shown in the drawing as emitter current IE and, except for the base currents discussed, corresponds to the emitter current IE in the differential amplifier, i.e. in the amplifier transistors 1, 2.

The second branch 23, 24 of the power transfer circuit in the example of embodiment shown in FIG. 5 corresponds as regards its structure and its operation to the first branch 21, 22. The second branch 23, 24 accordingly derives a second current from the collector current of the first amplifier transistor 1 and this second current is applied to the emitter terminal of the second emitter-follower transistor 12. For this purpose, the third current mirror arrangement 23 has an input 35 which is connected to the collector terminal of the first amplifier transistor 1. An output 36 of the third current mirror arrangement 23 is connected to input 37 of the fourth current mirror arrangement 24. At the output 38 of the fourth current mirror arrangement 24, which output is connected to the emitter terminal of the second emitter-follower transistor 12, the second current is supplied. In the example of embodiment shown in FIG. 5 also the second current corresponds to the emitter current IE except for the said base currents.

Basically, the amplifier transistors 1, 2, the emitter-follower transistors 11, 12 and the current mirrors 21 to 24 may have different dimensions as long as these dimensions are selected so that the first current in proportion to the collector current of the second amplifier transistor 2, and the second current in proportion to the collector current of the first amplifier transistor 1 are such that the said base-emitter voltages on the amplifier transistors 1, 2 and on the emitter-follower transistors 11, 12 compensate each other as regards their non-linear influences. These proportions may be adjusted, more specifically, by the current mirror ratios of the current mirror arrangements 21 to 24 and the choice of the surfaces of the amplifier transistors 1, 2 and of the emitter-follower transistors 11, 12. Also, in lieu of the emitter resistors, 3, 4, arbitrary impedances having arbitrary values may be used. Preferably are used, however, the same transistors and ohmic emitter resistors with corresponding values. The current mirror arrangements 21 to 24 preferably have a current mirror ratio of 1. The emitter current IE is then the sum of the emitter resistances 3, 4 and of the differential voltage UD according to Ohm's law.

Since the electric potential at the input 31 of the first current mirror arrangement 21 is unaffected by the potential at the output 34 of the second current mirror arrangement 22, it is avoided that the second amplifier transistor 2 becomes saturated. Accordingly holds for the second branch 23, 24 of the power transfer circuit and the first amplifier transistor 1.

The arrangement shown in FIG. 5 further includes a third and a fourth amplifier transistor 41, 42 respectively, which are emitter-coupled via two series-arranged emitter resistors 43, 44. In lieu of the emitter resistors 43, 44, there may also be used two random emitter impedances. From the node between the emitter resistors 43, 44 a constant-current source 26, which carries a constant current I012, is connected to ground 6.

Preferably, the arrangement comprising the amplifier transistors 41, 42, the emitter resistors 43, 44 and the constant-current source 26 is preferably dimensioned in identical manner to the amplifier transistors 1, 2 and their wiring. As a result, also the constant currents I011 and I012 correspond thereto. Since the base terminals of the amplifier transistors 41, 42 are also supplied with the same differential voltage as the base terminals of the amplifier transistors 1, 2, the collector current IC or emitter current IE respectively, in this differential arrangement 41, 42 corresponds to the currents described above with respect to the amplifier transistors 1, 2. The collector current IC on the amplifier transistors 41, 42 is then tapped from the circuit as shown in FIG. 5 as output current of the differential amplifier. The characteristic curve between this output current—collector current IC—and the differential voltage UD on the base terminals of the emitter-follower transistors 11, 12 is shown in FIG. 6. It is a largely linear characteristic curve without conspicuous, non-linear "bends" in the upper dynamic ranges. When the highest values for the collector current IC are reached, this current remains stable even with a rather large voltage swing.

FIG. 7 shows a modification of the example of embodiment shown in FIG. 5, in which elements corresponding to FIG. 5 have like reference characters. This particularly relates to the emitter-follower transistors 11, 12, the amplifier transistors 1, 2, 41, 42, the emitter resistors 3, 4, 43, 44 and the associated constant-current sources 25, 26.

The example of embodiment shown in FIG. 7 represents a power transfer circuit whose first branch is used for deriving the first current from the collector current of the first amplifier transistor 1 and its second branch for deriving the second current from the collector current of the second amplifier transistor 2. For this purpose, the first branch of the embodiment of the power transfer circuit as shown in FIG. 7 not only comprises the first current mirror arrangement 21, but also a first current reversing stage 27 which is here used as a substitute for the second current mirror arrangement 22. Accordingly, the second branch of the power transfer circuit shown in FIG. 7 comprises in addition to the third current mirror arrangement 23 a second current reversing stage 28. The first current reversing stage 27 in essence comprises a constant-current source 29, which carries a constant current I03. The constant-current source 29 is connected with one of its terminals to a connection between the emitter terminal of the first emitter-follower transistor 11 and the output 32 of the first current mirror arrangement 21. With its second terminal the constant-current source 29 is connected to ground 6. Accordingly, the second current reversing stage 28 in the second branch of the power transfer circuit shown in FIG. 7 in essence comprises a constant-current source 30 which produces a constant current I04 and is connected, on one side to ground 6, whereas it is connected on the other side to a node between the emitter terminal of the second emitter-follower transistor 12 and the output 36 of the third current mirror arrangement 23. The base terminals of the amplifier transistors 1, 2 are invariably connected to the emitter terminals of the emitter-follower transistors 11, 12.

In the power transfer circuit shown in FIG. 7, the collector current in its first branch 21, 27 is applied by the first amplifier transistor 1 to the input 31 of the first current mirror arrangement 21 and mirrored therein to the output 32. Apart from being connected to the base terminals of the amplifier transistors 1, 41 which consume hardly any current, and to the constant-current source 29 which carries only a constant current I03, this output 32 is connected only to the emitter terminal of the first emitter-follower transistor 11 as a result of the connection in the current reversing stage 27. Consequently, at least substantially all the AC components of the emitter current IE of the first amplifier transistor 1 will flow from the output 32 of the first current mirror arrangement 21 into the emitter terminal of the first emitter-follower transistor 11. In FIG. 7 these directions of current are again indicated by arrows just like the previous Figures. Accordingly, also the collector current of the second amplifier transistor 2, whose AC component corresponds to that of the first amplifier transistor 1 and is also referenced IE, is applied, via the third current mirror arrangement 23 and the second current reversing stage 28 of the second branch, to the emitter terminal of the second emitter-follower transistor 12. The decoupling of the electric potentials of the emitter terminals of the emitter-follower transistors 11 and 12 from those of the collector terminals of the amplifier transistors 1, 2 respectively, is effected here by the current mirror arrangements 21, 23 alone.

The example of embodiment shown in FIG. 7 has, compared to the example of embodiment shown in FIG. 5, a reduction of the number of necessary circuit elements and thus a simplification of the circuit. Here the emitter impedances 3, 4, 43, 44 may be selected at will too; preferably, however, ohmic emitter resistors having corresponding values are selected. Also all the constant currents I03, I04, I011, I012 of the constant-current sources 29, 30, 25 and 26 respectively, are selected preferably equal. Also the emitter currents of the first amplifier transistor 1 and the second emitter-follower transistor 12 correspond thereto, as do those of the second amplifier transistor 2 and the first emitter-follower transistor 11. The characteristic curve is shown in FIG. 6.

Also in the example of embodiment shown in FIG. 7, the amplifier transistor pair 41, 42 is used for amplifying the useful signal, i.e. for producing the output currents. Basically, here too the amplifier transistors 1, 2 deliver the desired linearized collector currents. They are necessary, however, as input currents for the current mirror arrangements 21, 23. For deriving the output currents, the collector currents of the emitter-follower transistors 11, 12 could also be used, or the current mirror arrangements 21, 23 could be accordingly moved away from each other. For the rest, also in the example of embodiment shown in FIG. 7, very small resistances for the emitter resistors 3, 4 could be used without detrimentally affecting the stability.

What is claimed is:

1. A differential amplifier comprising at least:
   a first amplifier transistor whose base terminal is coupled to an emitter terminal of a first emitter-follower transistor,
   a second amplifier transistor whose base terminal is coupled to an emitter terminal of a second emitter-follower transistor,
   a first emitter impedance across which the emitter terminals of the first and second amplifier transistors are coupled to each other,
   while base terminals of the emitter-follower transistors can be supplied with a differential voltage for controlling the differential amplifier,
   characterized by a power transfer circuit by which the emitter terminal of the first emitter-follower transistor, while being voltage decoupled, is supplied with a first current which has a proportion to a collector current in a collector terminal of the second amplifier transistor that is predefined by the configuration of the first emitter-follower transistor and of the second amplifier transistor, so that a base-emitter voltage occurring on the first emitter-follower transistor at least substantially matches a base-emitter voltage occurring on the second amplifier transistor and by which a second current is applied to the emitter terminal of the second emitter-follower transistor which is voltage decoupled, which second current has a proportion to a collector current in a collector terminal of the first amplifier transistor that is predefined by the configuration of the second emitter-follower transistor and of the first amplifier transistor, so that a base-emitter voltage occurring on the second emitter-follower transistor at least substantially matches a base-emitter voltage occurring on the first amplifier transistor.

2. A differential amplifier as claimed in claim 1, characterized in that the power transfer circuit in the differential amplifier according to the invention comprises at least one current mirror arrangement for deriving the first or second current respectively from the collector currents of the amplifier transistors.

3. A differential amplifier as claimed in claim 2, characterized in that the power transfer circuit comprises a first branch for deriving the first current from the collector current of the second amplifier transistor and the second branch for deriving the second current from the collector current of the first amplifier transistor.

4. A differential amplifier as claimed in claim 3, characterized in that the first and the second branch comprise each at least one current mirror arrangement.

5. A differential amplifier as claimed in claim 1, characterized in that the power transfer circuit comprises a first branch for deriving the first current from the collector current of the first amplifier transistor and a second branch for deriving the second current from the collector current of the second amplifier transistor.

6. A differential amplifier as claimed in claim 5, characterized in that the first and the second branch comprise each at least one current mirror arrangement and at least one current reversing stage each.

7. A differential amplifier as claimed in claim 1, characterized by:
   a third amplifier transistor whose base terminal is coupled to the base terminal of a first amplifier transistor,
   a fourth amplifier transistor whose base terminal is coupled to the base terminal of the second amplifier transistor,
   at least a second emitter impedance via which the emitter terminals of the third and fourth amplifier transistors are coupled to one another, and in that
   output currents of the differential amplifier can be derived from collector terminals of the third and fourth amplifier transistors.

8. A differential amplifier as claimed in claim 4, characterized in that each one of the current mirror arrangements of the first and second branches of the power transfer circuit is arranged for deriving an output current of the differential amplifier.

9. A differential amplifier as claimed in claim 1, characterized in that an output current of the differential amplifier is tapped from a collector terminal of each emitter-follower transistor.

* * * * *